(12) United States Patent
Kurosaki et al.

(10) Patent No.: US 7,206,232 B2
(45) Date of Patent: Apr. 17, 2007

(54) SEMICONDUCTOR DEVICE AND SOURCE VOLTAGE CONTROL METHOD

(75) Inventors: Kazuhide Kurosaki, Tokyo (JP); Shigekazu Yamada, Tokyo (JP); Masaru Yano, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 5 days.

(21) Appl. No.: 11/165,008

(22) Filed: Jun. 23, 2005

(65) Prior Publication Data

US 2005/0286328 A1 Dec. 29, 2005

Related U.S. Application Data

(63) Continuation of application No. PCT/JP2004/008998, filed on Jun. 25, 2004.

(51) Int. Cl.
*G11C 11/34* (2006.01)

(52) U.S. Cl. .............. 365/185.25; 365/185.2; 365/185.28; 365/207

(58) Field of Classification Search .......... 365/185.25, 365/207

See application file for complete search history.

(56) References Cited

U.S. PATENT DOCUMENTS

| | | | | |
|---|---|---|---|---|
| 4,542,485 A | | 9/1985 | Iwahashi et al. ............ 365/230 |
| 5,590,076 A | * | 12/1996 | Haddad et al. ......... 365/185.25 |
| 5,943,262 A | * | 8/1999 | Choi ..................... 365/185.17 |
| 5,943,266 A | | 8/1999 | Ogura et al. ........... 365/185.28 |
| 6,108,238 A | * | 8/2000 | Nakamura et al. ...... 365/185.22 |
| 6,411,273 B1 | * | 6/2002 | Nakamura et al. ............ 345/98 |
| 6,473,341 B1 | * | 10/2002 | Gomiero et al. ........ 365/185.28 |
| 2002/0041530 A1 | * | 4/2002 | Ogane ........................ 365/204 |
| 2003/0072176 A1 | | 4/2003 | Watanabe |
| 2003/0117848 A1 | * | 6/2003 | Hoang .................... 365/185.11 |
| 2005/0057966 A1 | * | 3/2005 | Nazarian ................ 365/185.01 |
| 2005/0232012 A1 | * | 10/2005 | Park ....................... 365/185.17 |
| 2006/0044872 A1 | * | 3/2006 | Nazarian ................ 365/185.17 |

FOREIGN PATENT DOCUMENTS

| | | |
|---|---|---|
| JP | 57-205895 A | 12/1982 |
| JP | 59-77700 A | 5/1984 |
| JP | 05-28778 A | 2/1993 |
| JP | 11-45587 A | 2/1999 |
| JP | 2003-123493 A | 4/2003 |
| WO | WO 2001/013377 A1 | 2/2001 |

* cited by examiner

*Primary Examiner*—Huan Hoang
*Assistant Examiner*—Ly Duy Pham

(57) ABSTRACT

The precharge circuit is provided for precharging, before programming the data, the voltage of the source line ARVSS commonly connected to the memory cells provided in the same sector. The voltage of the source line ARVSS of the memory cell MC is precharged before programming the data, and the voltage of the source line ARVSS of the memory cell MC is not lowered at the time of programming the data, even if the data programming period is shortened. It is thus possible to prevent the leak current during the programming and program the data into the memory cell MC optimally.

6 Claims, 6 Drawing Sheets

US 7,206,232 B2

SEMICONDUCTOR DEVICE AND SOURCE VOLTAGE CONTROL METHOD

CROSS REFERENCE TO RELATED APPLICATION

This is a continuation of International Application No. PCT/JP2004/008998, filed Jun. 25, 2004.

BACKGROUND OF THE INVENTION

1. Field of the Invention

The present invention relates to semiconductor devices, and more particularly, to a control method of a source voltage of a memory cell.

2. Description of the Related Art

FIG. 1 is a configuration of a conventional semiconductor device. A cell array portion 100 composed of multiple memory cells MC includes the memory cells MC at intersections at which word lines WL intersect with bit lines BL. A gate of each memory cell MC is connected to a word line WL, and a drain terminal is connected to the bit line BL. The cell array portion 100 shown in FIG. 1 denotes one sector, which is a unit of reading, programming, or erasing data. A source terminal of the memory cell MC in the same sector is connected to a common source line ARVSS.

The memory cell MC retains a state of data "1" in which a floating gate is not charged and another state of data "0" in which the floating gate is charged. A threshold voltage is low at the data "1", and the threshold voltage is high at the data "0".

When the data is read, a given voltage is applied to the word line WL, an n-type MOS transistor (hereinafter, referred to as nMOS transistor) 104 shown in FIG. 1 is turned on, and the source line ARVSS is set to a ground voltage. Thus, the stored data is read according to the difference in the two states of the drain current. Also, when the data is written, a high voltage of approximately 6 V is applied to the bit line BL connected to the selected memory cell MC to be written, and a high voltage of approximately 10 V is applied to the word line WL so that a hot electron generated by flowing the current through the cell may be injected into the floating gate. 0 V is applied to the word line that is not selected so that the unselected memory cell may not be conducted.

However, even if the word line of the unselected memory cell MC is controlled at 0 V, the unselected memory cell MC turns on in some cases. The high voltage is applied to the bit line BL of the selected memory cell. A coupling effect of the drain lines of the selected memory cell and the unselected memory cell connected to the bit line BL boosts the voltage of the floating gate of the unselected memory cell MC, and accordingly the unselected memory cell MC turns on. Then, a leakage current flows through the bit line BL from the unselected memory cell MC. The voltage drop in the parasitic resistance of the bit line BL drops the drain voltage of the selected memory cell MC. The source-drain voltage becomes insufficient and there arises a problem in the program operation.

A control method is employed for setting the voltage of the source line ARVSS at the time of programming to be slightly higher than the ground voltage in order to prevent the problem in the programming operation. That is, an nMOS transistor 103 is turned on by a program signal (PGM) when the data is written and a programming current is passed through a resistor 105 provided between the source line ARVSS and the ground so that the source line ARVSS may have the voltage slightly higher than the ground voltage Vss. When the data is not written, an nMOS transistor 104 is turned on so that the voltage of the source line may be controlled to the ground voltage Vss.

Patent Document 1 (Japanese Patent Application Publication No. 2003-123493) describes that the source voltage of the selected cell transistor is changed according to the distance between the selected cell transistor and the program voltage generation circuit that makes the bit line at a high voltage.

These days the semiconductor device is designed to have a large capacity, and accordingly the cell array region is larger than ever. When the cell array region becomes larger, the resistances of the bit line and the source line become too large to be ignored. At the same time, the programming period into the memory cell is designed to be shorter, and the pulse width for programming is configured as small as possible.

Therefore, even if the source line having a large load is charged in a short period of time, the voltage of the source line is insufficient. There arises a problem in that the programming efficiency is degraded due to the leakage current. Patent Document 1 does not describe the aforementioned technical problem.

In the method of biasing the source line by providing the resistor between the source line and the ground, the degree of the voltage drop to the ground varies depending on the position of the cell to be programmed, and the value of the current is not constant at the time of programming. It is difficult to control the voltage of the source line accurately at a constant level.

SUMMARY OF THE INVENTION

The present invention has been made in view of the above circumstances and has an object of providing a semiconductor device and a source voltage control method so that the data is programmed optimally to the memory cell even if the data-programming period is shortened.

According to an aspect of the present invention, preferably, there is provided a semiconductor device including: a memory cell; and a precharge circuit that precharges a source line connected to the memory cell before the memory cell is programmed.

The source voltage of the memory cell is not reduced even if the programming period is shortened, by precharging the source line of the memory cell before data programming. It is thus possible to prevent the leakage current at the time of programming the data and thereby the data can be programmed onto the memory cell optimally, On the above semiconductor device, the precharge circuit includes a circuit that precharges the source line when a gate voltage of the memory cell is being boosted.

It is possible to precharge the source line to the sufficient voltage before programming the data, when the source line is precharged to the sufficient voltage before programming the data.

On the above semiconductor device, the precharge circuit includes a circuit that compares a reference voltage with a voltage of a common source line selectively connected to one of source lines associated with sectors, and precharges the common source line to a given constant level.

It is possible to precharge the source line of the sector to a desired voltage, when the common source line precharged by the precharge circuit is connected to the source line of the selected sector. The precharge circuit charges the common source line by comparing the voltage of the common source line with the reference voltage so that the voltage of the common source line may be kept constant.

On the above semiconductor device, the precharge circuit includes a circuit that compares a reference voltage with a voltage of an interconnection line via which the source line is connected to the precharge circuit, and controls the source line at a given constant level.

It is possible to set the source line of the memory cell properly, by comparing the reference voltage with the voltage of the interconnection that connects the source line of the memory cell and the precharge circuit.

On the above semiconductor device, further included is a clamp circuit that clamps the source line at a given level or lower.

When the voltage of the source line becomes too high, the transistor that operates at a low voltage does not operate properly and the programming efficiency onto the memory cell is degraded. However, thus provided clamp circuit can avoid the degradation in the programming efficiency, and it is possible to optimize the data programming into the memory cell.

On the above semiconductor device, the clamp circuit clamps the source line at the given level or lower only when a high voltage is applied to a drain of the memory cell.

The voltage of the source line is controlled not to be higher than a certain level only while a high voltage is being applied to the drain of the memory cell. This can make it possible to operate the clamp circuit during a required period.

On the above semiconductor device, the clamp circuit compares a reference voltage with a voltage of a common source line selectively connected to one of source lines associated with sectors, and precharges the common source line to a given constant level.

The voltage of the common source line is controlled to be kept constant, by comparing the voltage of the common source line with the reference voltage. It is thus possible to maintain the voltage of the source line at a constant value.

On the above semiconductor device, the clamp circuit compares a reference voltage with a voltage of an interconnection line via which the source line is connected to the precharge circuit, and controls the source line at a given constant level.

The voltage of the source line of the memory cell can be configured at a desired value accurately, by comparing the reference voltage with the voltage of the interconnection that connects the source line of the memory cell and the precharge circuit.

According to another aspect of the present invention, preferably, there is provided a semiconductor device including: a semiconductor device including a memory cell; and a clamp circuit that controls a source line connected to the memory cell at a given constant level or lower when the memory cell is programmed.

When the voltage of the source line becomes too high, the transistor that operates at a low voltage does not operate properly and the programming efficiency onto the memory cell is degraded. However, thus provided clamp circuit can avoid the degradation in the programming efficiency, and it is possible to optimize the data programming into the memory cell.

On the above semiconductor device, the precharge circuit includes a circuit that controls the source line at the given constant level or lower only when a high voltage is being applied to a drain of the memory cell.

The voltage of the source line is controlled to be equal to or lower than a given value while a high voltage is being applied to the drain of the memory cell. It is possible to operate the clamp circuit during a required period.

On the above semiconductor device, the clamp circuit includes a circuit that compares a reference voltage with a voltage of a common source line selectively connected to one of source lines associated with sectors, and controls the common source line at a constant level.

The voltage of the common source line is controlled to be kept constant, by comparing the voltage of the common source line with the reference voltage. It is thus possible to maintain the voltage of the source line at a constant value.

On the above semiconductor device, the clamp circuit compares a reference voltage with a voltage of an interconnection line via which the source line is connected to the precharge circuit, and controls the source line at the given constant level or lower.

The voltage of the source line of the memory cell can be configured at a desired value accurately, by comparing the reference voltage with the voltage of the interconnection that connects the source line of the memory cell and the precharge circuit.

On the above semiconductor device, further including a resistor via which wherein the source line connected to the memory cell that is selected at the time of programming is grounded.

The source line of the selected memory cell is connected to the ground by way of the resistor at the time of data programming, and the programming current is applied to the source line and the resistor. It is thus possible to bias the source line.

On the above semiconductor device, the memory cell has a floating gate made of polysilicon in which electrons are stored.

When the memory cell employs the floating gate of a polysilicon, the voltage of the floating gate in the unselected memory cell is increased by the coupling. This causes a problem of the leakage current. When the semiconductor device in accordance with any one of claims 1 through 12 is employed, the leakage current can be prevented at the time of data programming.

According to another aspect of the present invention, preferably, there is provided a method comprising the steps of: precharging a source line connected to a memory cell before the memory cell is programmed; and programming the memory cell.

It is possible to prevent the source voltage of the memory cell from decreasing even if the data programming period is shortened, after the source line of the memory cell is precharged before programming the data. It is thus possible to prevent the current from leaking at the time of programming the data and optimize the data programming onto memory cell.

On the above semiconductor device, the step of precharging comprises a step of precharging the source line when a gate voltage of the memory cell is being boosted.

The voltage of the source line is precharged while the gate voltage of the memory cell is being boosted, and the source line can be precharged to the sufficient voltage before programming the data.

On the above semiconductor device, further including a step of controlling the source line at a given voltage or lower at the time of programming of the memory cell.

If the source voltage becomes too high, the transistor of a low operation voltage does not operate normally and the programming efficiency is degraded. The clamp circuit can prevent the programming efficiency from degrading.

On the above semiconductor device, the step of controlling the source line at the given voltage only when a high voltage is being applied to a drain of the memory cell.

The source voltage is controlled not to become higher than a certain value only while a high voltage is being applied to the drain of the memory cell. It is possible to operate the clamp circuit during the desired period.

The present invention is capable of preventing the source voltage of the memory cell from decreasing at the time of the data programming, even if the data programming period is shortened. It is thus possible to prevent the leakage current at the time of data programming and optimize the data programming onto the memory cell.

DESCRIPTION OF THE PREFERRED EMBODIMENTS

A description will now be given, with reference to the accompanying drawings, of embodiments of the present invention.

First Embodiment

Figure 1:
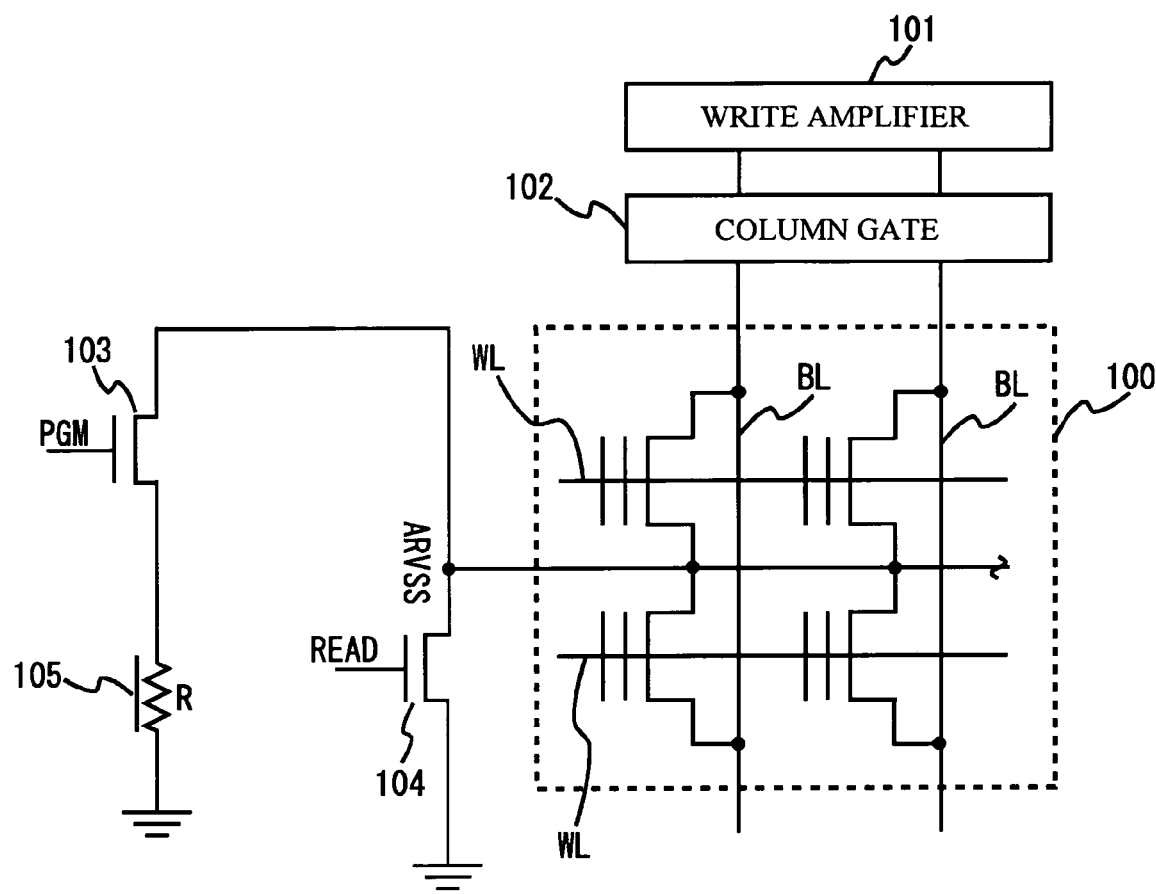
FIG. 1 is a configuration of a conventional semiconductor device and shows a conventional control method of a source voltage.
Figure 2:
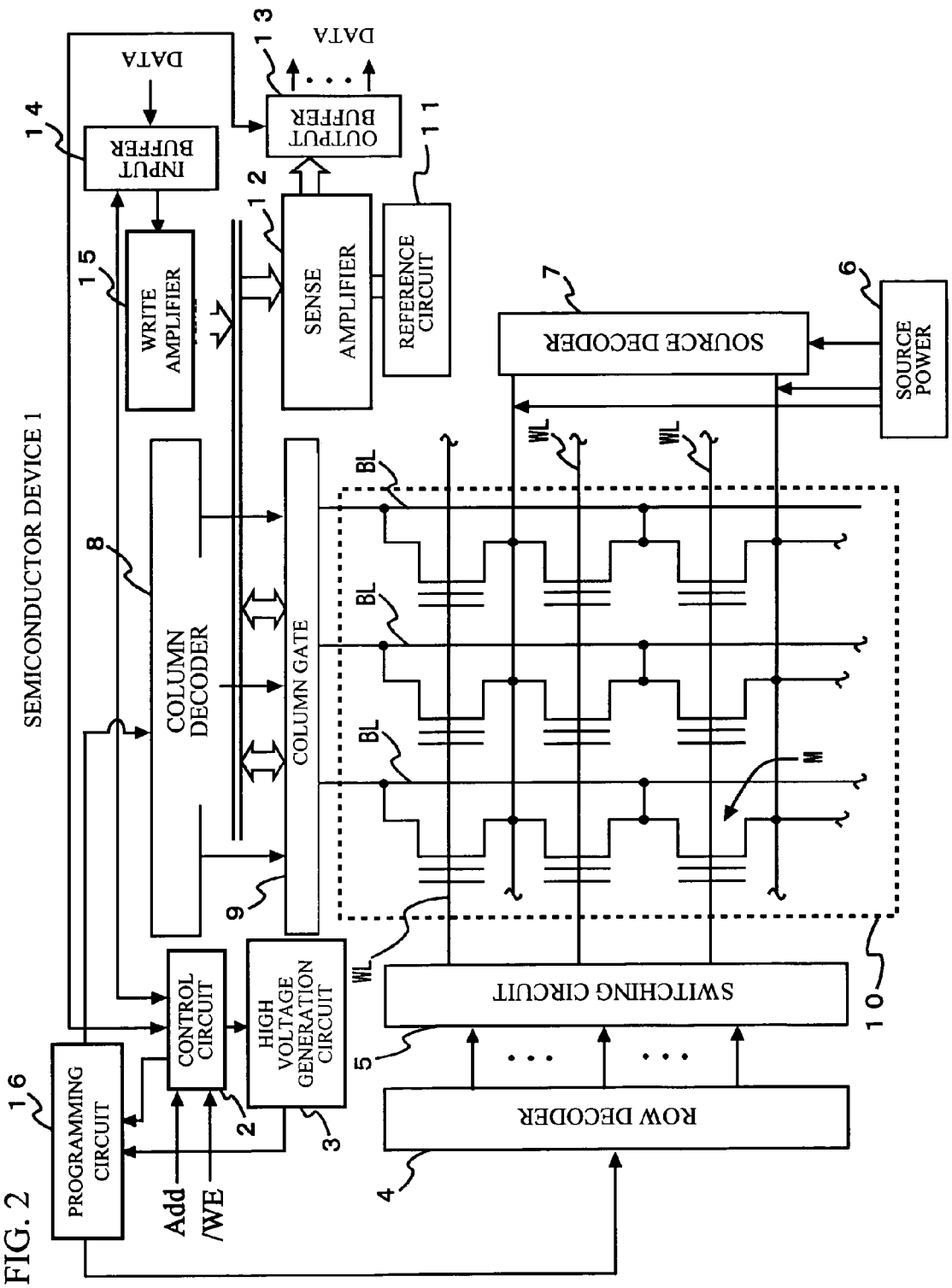
FIG. 2 is a configuration of a semiconductor device of the present invention.

First, referring to FIG. 2, a description will be given of a semiconductor device in accordance with the present embodiment of the present invention. A semiconductor device as shown in FIG. 2 includes a control circuit 2, a high-voltage generation circuit 3, a row decoder 4, a switching circuit 5, a source power 6, a source decoder 7, a column decoder 8, a column gate 9, a cell array portion 10, a reference circuit 11, a sense amplifier (comparison circuit) 12, an output buffer 13, an input buffer 14, a write amplifier 15, and a programming circuit 16. The semiconductor device 1 may be a semiconductor memory device such as a flash memory, which is packaged as a single unit, or may be incorporated into the semiconductor device as a part such as a system LSI.

The cell array portion 10 includes a control gate connected to the word line WL, a drain connected to the bit line BL, a source connected to a source line ARVSS, a non-volatile memory cell MC having a floating gate made of polysilicon as a layer for storing the charge. Multiple memory cells MC are arranged in a matrix.

The control circuit 2 receives a control signal such as a write enable (/WE) or the like, an address signal, and a data signal from the outside, and servers as a state machine based on these signals. The control circuit 2 controls the respective internal circuits to program, erase, or read.

The high-voltage generation circuit 3 controls the power supply voltage Vcc at a given level so as to generate a bit line voltage and a word line voltage, and supply the bit line voltage and word line voltage to the programming circuit 16. The row decoder 4 decodes an address supplied from an address buffer, which is not shown. The switching circuit 5 activates the word line WL of the memory cell according to the decoded result. The source power 6 supplies the power to the source decoder 7 and the source decoder 7 selects the source line ARVSS. The column decoder 8 decodes the address supplied by the address buffer, which is not shown.

The column gate 9 selectively connects the bit line BL of the cell array portion 10 to the sense amplifier 12 based on the decoded address signal at the time of reading the data. The column gate 9 selectively connects the bit line BL to the write amplifier 15 at the time of programming. A path for reading/programming the data is thus established for the memory cell MC in the cell array portion 10.

The reference circuit 11 includes a reference cell (transistor) to which the gate voltage is applied and a circuit portion that shifts the reference level of the reference cell. The reference cell is used for several reference cells for reading, programming, erasing, convergence, and the like.

The sense amplifier 12 compares the data in the memory cell MC with that in the reference cell, and judges whether the data in the memory cell MC is 0 or 1. The judgment result is supplied to the output buffer 13, as a read-out data.

The programming circuit 16 drives the row decoder 4 and the column decoder 8 to perform the data programming operation on the memory cell MC under the control of the control circuit 2.

The verify operation according to the programming operation and erase operation is performed by comparing the current of the data with the reference current. The current of the data is supplied from the memory cell MC designated by the row decoder 4 and the column decoder 8. The reference current is the current in the reference cell for the program verification and the reference cell for the erase verification.

The data input from the outside is stored in the input buffer 14 once, and the data is programmed into the bit line BL selected by the column decoder 8 by the write amplifier 15. Thus, the data is programmed into the selected memory cell MC.

Figure 3:
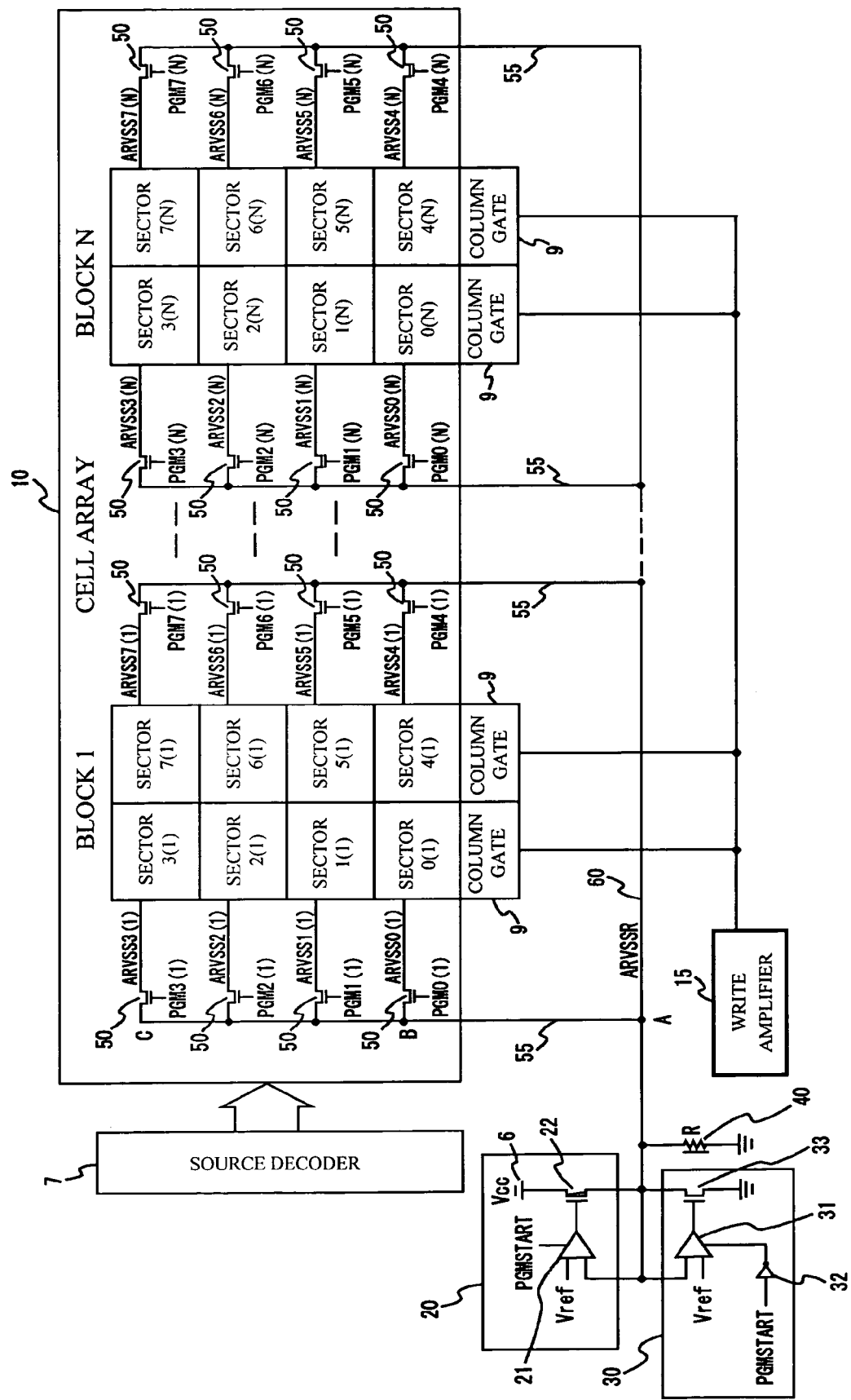
FIG. 3 is a view showing a cell array portion and functional parts that control the voltage of the source line in the memory cell MC.

Next, a description will be given of a functional portion that adjusts the voltage of the source line ARVSS in the memory cell MC, with reference to FIG. 3. First, a description will be given of the configuration of the cell array portion 10. As shown in FIG. 3, the cell array portion 10 is composed of multiple blocks (FIG. 3 shows a block 1 through a block N). Each block includes multiple sectors, each of which is a unit for programming and erasing. In accordance with the present embodiment, there are provided eight sectors (sector 0 through sector 7) in one block. A given number of the memory cells MC is provided in each sector.

The multiple memory cells MC included in the same sector are connected to a commonly provided source line ARVSS. For example, all the memory cells MC in a sector 3(1) are connected to a source line ARVSS 3(1) as shown in FIG. 3. All the memory cells MC in a sector 2(N) are connected to a source line ARVSS 2(N). Here, the sector 3(1) denotes the third sector included in the block 1.

An nMOS transistor 50 is provided on each source line ARVSS for selectively changing the activation or non-activation of the source line ARVSS. The program signal PGM is input into the gate of the nMOS transistor 50 from the source decoder 7. A program signal PGM3(1) is input into the nMOS transistor 50 for selectively changing the activation and non-activation of the sector 3(1) from the source decoder 7. When this program signal PGM turns on the nMOS transistor 50, the source line ARVSS of the memory cell MC in the corresponding sector is connected to a common source line ARVSSR60 through an interconnection 55. At the time of reading the data, the common source line ARVSSR60 serves as the ground potential Vss (not shown), and at the time of programming the data, the common source line ARVSSR60 is set to a given voltage (0.6 V in accordance with the present embodiment). A resistor 40 is connected to the common source line ARVSSR60 to make the current flow from the source power 6 to the common source line ARVSSR60. The common source line ARVSSR60 is set to have a given voltage by flowing the programming current to the resistor 40. The common source line ARVSSR60 serves as an interconnection to which the source of each sector (the memory cells MC) is commonly connected. A precharge circuit 20 and a clamp circuit 30 are connected to the common source line ARVSSR60.

The precharge circuit 20 includes a differential amplifier circuit 21 and a p-type MOS transistor (hereinafter, referred to as pMOS transistor) 22. A PGMSTART signal (control signal) is input into the differential amplifier circuit 21 so as to control the operation of the differential amplifier circuit 21. The differential amplifier circuit 21 outputs a signal to the gate of the pMOS transistor 22, according to the logical calculation of a reference voltage Vref and the voltage of the common source line ARVSSR60. The pMOS transistor 22 connects the gate to the output of the differential amplifier circuit 21, connects the drain to the common source line ARVSSR60, and connects the source to the power voltage Vcc from the source power 6.

The PGMSTART signal (control signal) becomes a high level while the gate voltage of the memory cell MC is being boosted after a program request, and then becomes a low level while a high voltage is being applied to the drain of the memory cell MC. The differential amplifier circuit 21 that controls the gate of the pMOS transistor 22 starts operating when the PGMSTART signal (control signal) becomes a high level. The differential amplifier circuit 21 keeps turning on the pMOS transistor 22 until the voltage of the common source line ARVSSR exceeds the reference voltage Vref, and precharges the common source line ARVSSR. In other cases, the differential amplifier circuit 21 outputs the high level to turn off the pMOS transistor 22.

The clamp circuit 30 is provided in parallel with the resistor 40 located between the common source line ARVSSR60 and the ground, as shown in FIG. 3. The clamp circuit 30 includes a differential amplifier circuit 31, an inverter 32, and an nMOS transistor 33. The output of the PGMSTART signal (control signal) is inverted in the inverter 32, and the inverted signal is input into the differential amplifier circuit 31. The differential amplifier circuit 31 outputs a signal to the gate of the nMOS transistor 33, according to the logical calculation of the reference voltage Vref and the voltage of the common source line ARVSSR60. The nMOS transistor 33 connects the gate to the output of the differential amplifier circuit 31, connects the drain to the common source line ARVSSR60, and connects the source to the ground.

The differential amplifier circuit 31 that controls the gate of the nMOS transistor 33 turns on the nMOS transistor 33 for clamping, when the voltage of the common source line ARVSSR60 reaches a given value or more while the PGMSTART signal (control signal) is in the low level (The input into the differential amplifier circuit 31 becomes a high level after inverted by the inverter 32.) That is, the differential amplifier circuit 31 operates so that the common source line ARVSSR60 may have the voltage of a given value or less. The differential amplifier circuit 31 outputs a low level in a period other than the above-mentioned period and turns off the nMOS transistor 33.

The nMOS transistor 50 arranged between the source line ARVSSR and the resistor 40 is not switched on because the nMOS transistor 50 has a low operational power voltage, when the voltage of the common source line ARVSSR60 rises too high. This causes a problem in that the nMOS transistor 50 does not turn on sufficiently. If the nMOS transistor 50 is switched on completely, there arises a problem in that the programming efficiency onto the memory cell MC is degraded. However, it is possible to prevent the degradation of the programming efficiency when the voltage of the common source line ARVSSR60 is clamped at a given value or less. It is thus possible to prevent the degradation of the programming efficiency in the memory cell MC.

Figure 4:
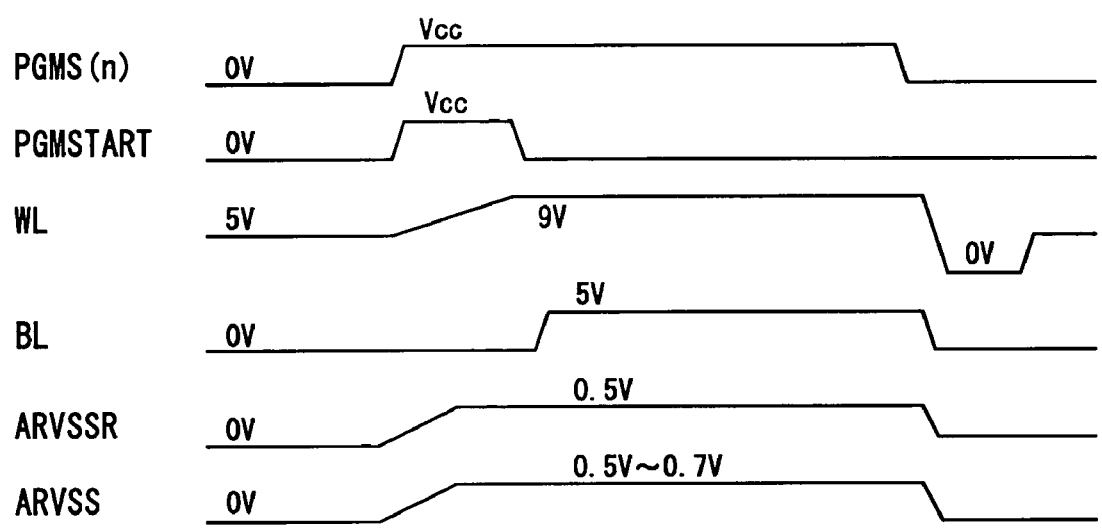
FIG. 4 is a chart showing timings and levels of voltage changes of the signal lines shown in FIG. 3.

FIG. 4 shows voltage levels and change timings thereof in the respective interconnections as described above. When the data programming operation starts, a PGMS(n) that turns on the nMOS transistor of the selected sector is set to the power voltage Vcc. At the same time, the PGMSTART signal (control signal) input into the precharge circuit 20 or the clamp circuit 30 is shifted to a high level. The PGMSTART signal (control signal) stays at a high level while the gate voltage of the memory cell MC is being boosted (while the word line WL shown in FIG. 4 is being boosted), and then becomes a low level in the actual programming period of applying the high voltage to the drain (while the high voltage is being applied to the bit line BL shown in FIG. 4).

The precharge circuit 20 starts operating when the PGMSTART signal (control signal) becomes a high level, and precharges the common source line ARVSSR60 at a given voltage. The common source line ARVSSR60 has been precharged in advance in this manner, and a desired voltage is already applied to the source line ARVSS at the time of actual programming (when a high voltage is applied to the bit line). It is thus possible to prevent the leakage current from flowing from the drain at the time of programming the data.

The clamp circuit 30 starts operating when the PGMSTART signal (control signal) shifts from the high level to the low level. The clamp circuit 30 turns on the nMOS transistor 33 for clamping, when the programming current is passed and the common source line ARVSSR60 becomes a certain value or more. That is, the voltage of the common source line ARVSSR60 is controlled to be constant. The clamp circuit 30 thus clamps the voltage of the common source line ARVSSR60 at a given value or less. It is possible to prevent the degradation of the programming efficiency onto the memory cell MC.

As shown in FIG. 4, the voltage of the source line ARVSS can be kept almost constant from approximately 0.5 V to 0.7 V. The differential amplifier circuit 21 in the precharge circuit 20 and the differential amplifier circuit 31 in the clamp circuit 30 respectively monitor the common source line ARVSSR60 connected to the ground. The voltage of the source line ARVSS is controlled at a constant value of 0.5 V. However, the source line ARVSS has variations in the voltage thereof more or less depending on the position of the sector, due to the voltage drop caused resulting from the difference in the lengths of the interconnections from the respective sectors to the common source line. For example, if a sector 0(1) in FIG. 3 is selected, AB is the interconnection length from the common source line ARVSSR60 to a source ARVSS0(1) of the sector, as shown in FIG. 3. If the sector 3(1) is selected, AC is the interconnection length. Therefore, the voltage drops are different between the respective sources ARVSS and the common source line ARVSSR60, according to the selected sector. The source line ARVSS has the voltage ranging from 0.5 V to 0.7 V.

The resistor 40 generates an IR drop while programming, and sets the common source line ARVSSR60 to a high voltage to some extent. However, the source voltage may be controlled by the precharge circuit 20 and the clamp circuit 30 without employing the resistor 40.

Second Embodiment

Figure 5:
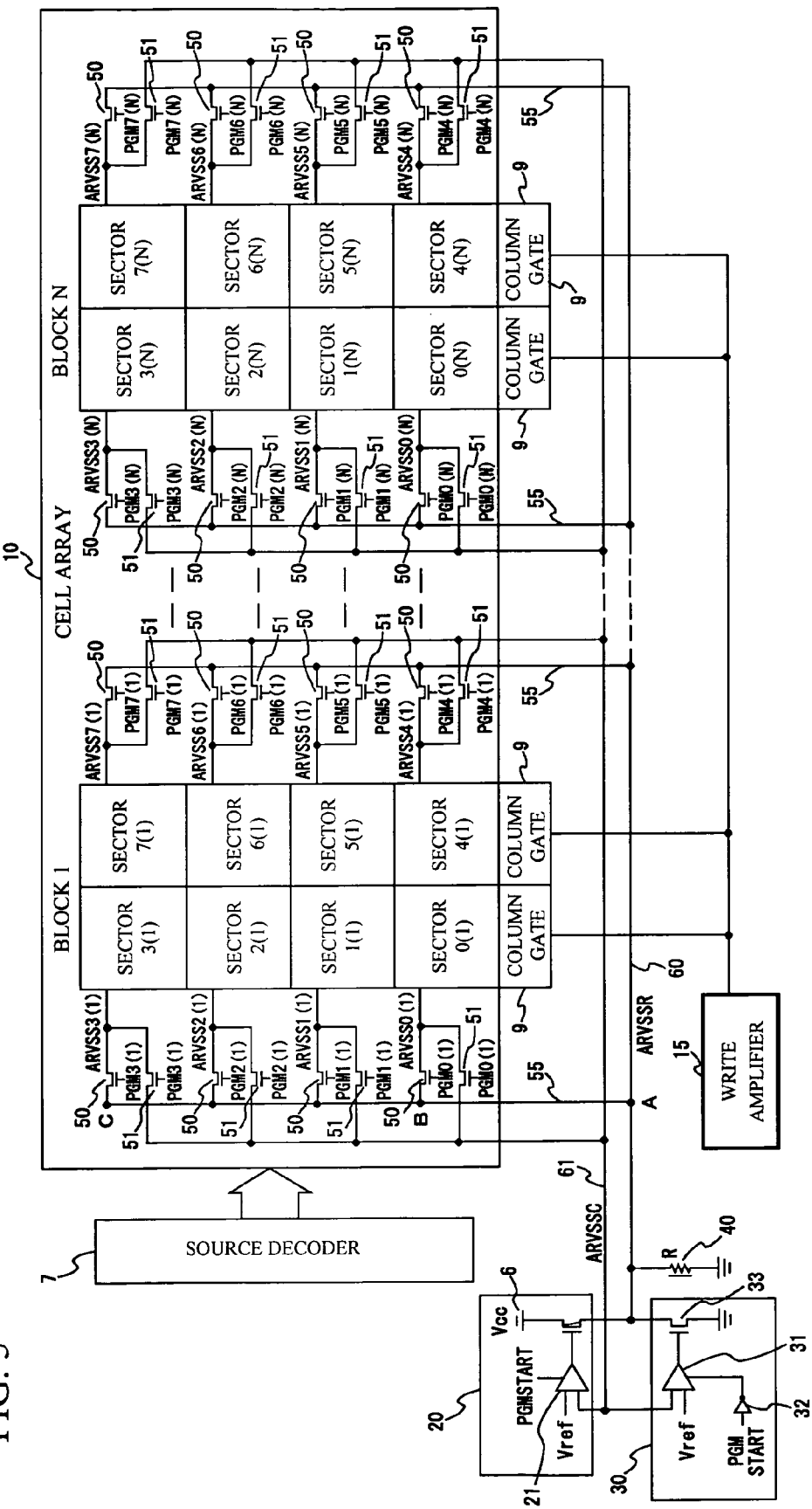
FIG. 5 is a view showing a configuration of the cell array portion of a second embodiment and the functional parts that control the voltage of the source line of the memory cell MC.
Figure 6:
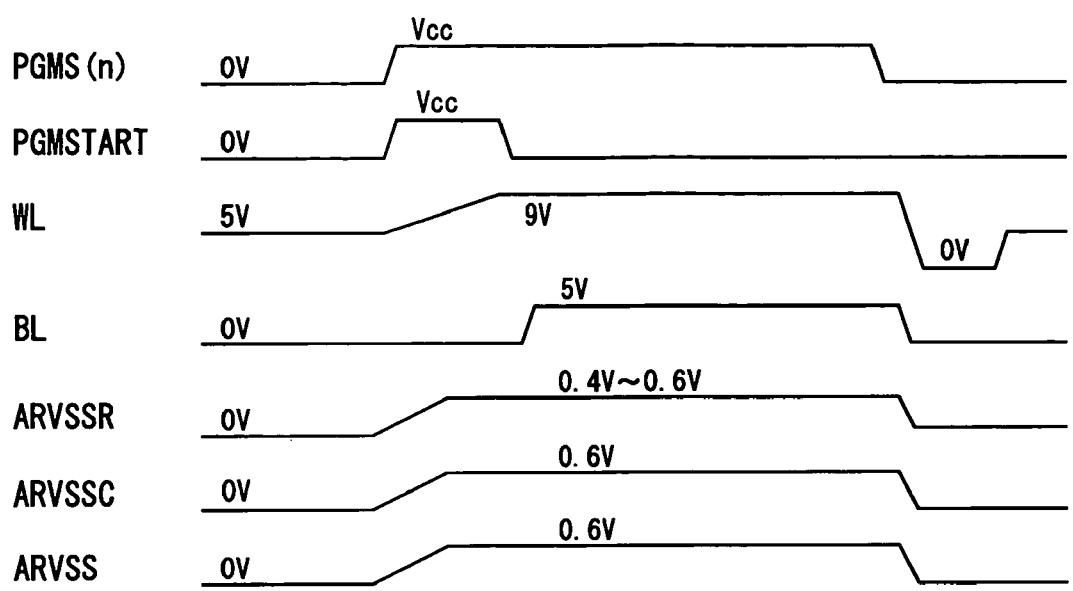
FIG. 6 is a timing chart showing the timings and levels of voltage changes of the signal lines shown in FIG. 5.

Next, a description will be given of a second embodiment of the present invention. FIG. 5 shows a configuration of the present embodiment. In the present embodiment, the voltages of the precharge circuit 20 and the clamp circuit 30 are not compared with the reference voltage Vref in the common source line ARVSSR60. The present embodiment includes another interconnection (ARVSSC) that does not include a path from the memory cell to the ground so as to compare the voltage on the interconnection with the reference voltage Vref. In accordance with the present embodiment, it is possible to eliminate the variations caused by the respective voltages of the source lines ARVSS in the sectors, although the variations are generated in the first embodiment.

An interconnection ARVSSC61 is provided for connecting to the source line ARVSS provided for each sector, as shown in FIG. 5 in accordance with the present embodiment. There is no path via which the current is passed from the memory cell to the ground. The interconnection ARVSSC61 is connected to each source line ARVSS by way of an nMOS transistor 51 that serves as a switch. The program signal PGM is output from the source decoder 7, and is input into the gate of the nMOS transistor 51. When the sector is selected and the source line ARVSS is connected to the common source line ARVSSR60, the nMOS transistor 51 turns on, and connects the interconnection ARVSSC61 to the source line ARVSS of the corresponding sector. The precharge circuit 20 and the clamp circuit 30 directly compares the voltage of the interconnection ARVSSC61 connected to the source line ARVSS of the selected sector with the reference voltage Vref, the voltage of the interconnection ARVSSC61, that is, the source line ARVSS is controlled to keep constant at 0.6 V. The voltage of the source line ARVSS is controlled via the interconnection (ARVSSC61) that does not have a path to the ground, and the voltage is constant regardless of the position of the sector. The common source line ARVSSR60 has the voltage between 0.4 V and 0.6 V. As in the first embodiment, the interconnection length between the source line ARVSS of each sector and the common source line ARVSSR60 varies depending on the location of the sector, and the voltage drop developing between the selected sector and the ground varies depending on the selected sector.

Although a few preferred embodiments of the present invention have been shown and described, it would be appreciated by those skilled in the art that changes may be made in these embodiments without departing from the principles and spirit of the invention, the scope of which is defined in the claims and their equivalents. For example, both of the precharge circuit 20 and the clamp circuit 30 are provided in the above-mentioned embodiments. However, one of the precharge circuit 20 and the clamp circuit 30 may be provided.

What is claimed is:

1. A semiconductor device comprising:
   a memory cell; and
   a precharge circuit that precharges a source line connected to the memory cell before the memory cell is programmed, wherein the precharge circuit includes a circuit that compares a reference voltage with a voltage of a common source line selectively connected to one of source lines associated with sectors, and precharges the common source line to a given constant level.

2. A semiconductor device comprising:
   a memory cell; and
   a precharge circuit that precharges a source line connected to the memory cell before the memory cell is programmed, wherein the precharge circuit includes a circuit that compares a reference voltage with a voltage of an interconnection line via which the source line is connected to the precharge circuit, and controls the source line at a given constant level.

3. The semiconductor device as claimed in claim 1 further comprising a clamp circuit, wherein the clamp circuit compares a reference voltage with a voltage of a common source line selectively connected to one of source lines associated with sectors, and precharges the common source line to a given constant level.

4. The semiconductor device as claimed in claim 2 further comprising a clamp circuit, wherein the clamp circuit compares a reference voltage with a voltage of an interconnection line via which the source line is connected to the precharge circuit, and controls the source line at a given constant level.

5. A semiconductor device comprising:
   a memory cell; and
   a precharge circuit that precharges a source line connected to the memory cell before the memory cell is programmed,
   further comprising a resistor via which wherein the source line connected to the memory cell that is selected at the time of programming is grounded.

6. The semiconductor device as claimed in claim 1, wherein the memory cell has a floating gate made of polysilicon in which electrons are stored.

* * * * *